（12) United States Patent
Kato

(10) Patent No.: US 8,461,819 B2
(45) Date of Patent: Jun. 11, 2013

(54) CURRENT DETECTOR FOR GUARDING AGAINST NEGATIVE POTENTIAL OF AN OUTPUT NODE THEREOF

(75) Inventor: Yuji Kato, Niiza (JP)

(73) Assignee: Sanken Electric Co., Ltd., Niiza-shi (JP)

( * ) Notice: Subject to any disclaimer, the term of this patent is extended or adjusted under 35 U.S.C. 154(b) by 338 days.

(21) Appl. No.: 12/911,179

(22) Filed: Oct. 25, 2010

(65) Prior Publication Data

US 2011/0101943 A1     May 5, 2011

(30) Foreign Application Priority Data

Oct. 30, 2009   (JP) ................................. 2009-250312

(51) Int. Cl.
    *G05F 1/00*         (2006.01)
(52) U.S. Cl.
    USPC ........................................ 323/282; 323/271
(58) Field of Classification Search
    USPC .................................................. 323/271, 282
    See application file for complete search history.

(56) References Cited

U.S. PATENT DOCUMENTS

| 5,212,618 | A * | 5/1993 | O'Neill et al. .................. 361/56 |
| 5,602,409 | A * | 2/1997 | Olney ........................... 257/362 |
| 6,861,832 | B2 * | 3/2005 | Perez ............................ 323/316 |
| 2001/0052777 | A1 * | 12/2001 | Belau et al. ................... 324/525 |

FOREIGN PATENT DOCUMENTS

JP          2009-80036        4/2009

* cited by examiner

*Primary Examiner* — Adolf Berhane
*Assistant Examiner* — Emily Pham
(74) *Attorney, Agent, or Firm* — Oblon, Spivak, McClelland, Maier & Neustadt, L.L.P.

(57) ABSTRACT

A current detector is comprised of a switch portion having an input node, an output node and a detection node, the switch portion being configured to selectively shift a power current between the input node and the output node and a detection current between the input node and the detection node; a current controller configured to control the detection current so as to equalize voltages at the detection node and the output node, the current controller being coupled with the detection node and the output node and including a transistor and a diode coupled to the transistor in series so as to prevent impression of negative voltage on the transistor, the transistor and the diode being formed within a single monolithic substrate; and a monitor current output portion having a monitor node and being coupled with the current controller, the monitor current output portion being configured to mirror the detection current in the current controller to the monitor node.

3 Claims, 5 Drawing Sheets

CURRENT DETECTOR FOR GUARDING AGAINST NEGATIVE POTENTIAL OF AN OUTPUT NODE THEREOF

CROSS-REFERENCE TO RELATED APPLICATIONS

This application is based upon and claims the benefit of priority from the prior Japanese Patent Application No. 2009-250312 (filed Oct. 30, 2009); the entire contents of which are incorporated herein by reference.

BACKGROUND OF THE INVENTION

1. Field of the Invention

The present invention relates to a current detector for detecting current flowing through a load, which is at least in part formed within a single monolithic substrate.

2. Description of the Related Art

In recent years, many electronic devices such as switches and regulators are integrated within a single monolithic substrate of a semiconductor in pursuit of downsizing. As many differently doped regions are disposed in mutually close relations, these regions in certain cases may form unintentional electronic elements, namely so-called "parasitic elements". Parasitic elements, if formed, lead to malfunction or deterioration of electronic properties.

SUMMARY OF THE INVENTION

The present invention is intended for providing a current detector at least in part formed within a single monolithic substrate, which mitigates or solves the issue of parasitic elements.

According to an aspect of the present invention, a current detector is comprised of a switch portion having an input node, an output node and a detection node, the switch portion being configured to selectively shift a power current between the input node and the output node and a detection current between the input node and the detection node; a current controller configured to control the detection current so as to equalize voltages at the detection node and the output node, the current controller being coupled with the detection node and the output node and including a transistor and a diode coupled to the transistor in series so as to prevent impression of negative voltage on the transistor, the transistor and the diode being formed within a single monolithic substrate; and a monitor current output portion having a monitor node and being coupled with the current controller, the monitor current output portion being configured to mirror the detection current in the current controller to the monitor node.

DETAILED DESCRIPTION OF THE PREFERRED EMBODIMENT

Certain embodiments of the present invention will be described hereinafter with reference to the appended drawings.

Figure 1:
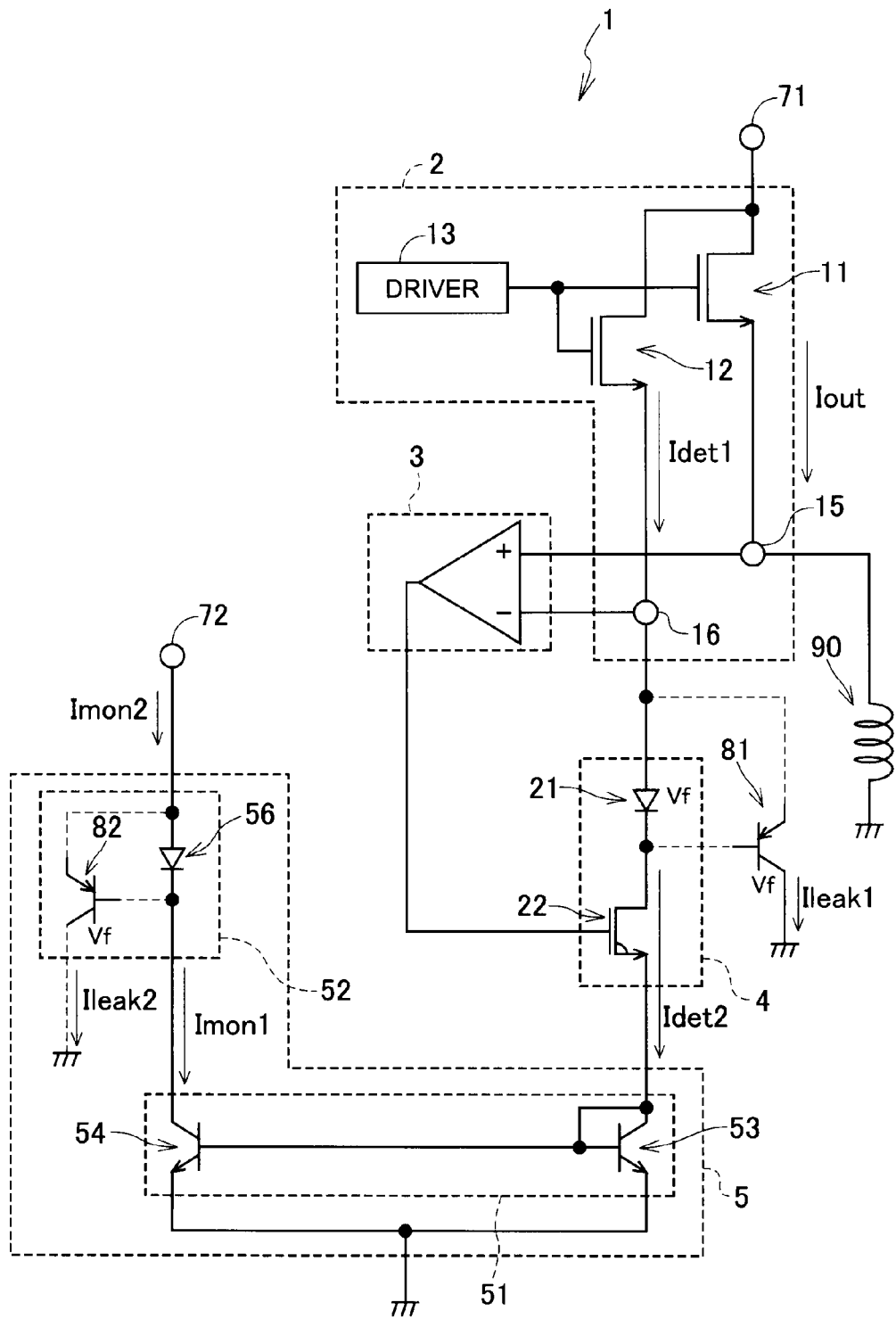
FIG. 1 is a circuit diagram of a current detector in accordance with a first embodiment of the present invention.

Referring to FIG. 1, a current detector 1 according to a first embodiment of the present invention is comprised of a switch portion 2, a current controller 4 with an operational amplifier (op-amp) 3, and a monitor current output portion 5. The whole or a part of these elements can be formed within a single monolithic semiconductor substrate although FIG. 2 merely shows limited portions of the current controller 4 and the monitor current output portion 5.

The switching portion 2 is comprised of an output MOSFET 11. The drain of the MOSFET 11 is coupled with an input node 71 to be coupled with a power source (not shown) and the source is coupled with an output node 15, thereby selectively shifting a power current Iout from the input node 71 to the output node 15 under control by impressed voltage on the gate. A load 90, exemplarily illustrated as an inductor in the drawings, can be coupled with the output node 15, thereby receiving the power current Iout when the MOSFET 11 is switched on. The MOSFET 11 is preferably of a vertical type.

The switching portion 2 is further comprised of a MOSFET 12. The drain of the MOSFET 12 is coupled with the input node 71 and the source is coupled with a detection node 16, thereby selectively shifting a detection current Idet1 from the input node 71 to the detection node 16 under control by impressed voltage on the gate. The MOSTFET 12 is also of a vertical type.

Preferably, the MOSFET 12 has a sufficiently smaller (1/1000 for example) plane area than that of the MOSFET 11. Thereby the detection current Idet1 is sufficiently smaller (1/1000 for example) than the output current Iout. It is beneficial in view of energy consumption even if the output current Iout is relatively large.

The gates of the MOSFETs 11, 12 are coupled with a driver circuitry 13 in parallel. Therefore the driver circuitry 13 selectively concurrently switches the MOSFETs 11, 12 so as to either shift or cut the power current Iout and the detection current Idet1.

As being coupled with both the output node 15 and the detection node 16, the op-amp 3 is provided. The non-inverting input of the op-amp 3 is coupled with the output node 15 and the inverting input is coupled with the detection node 16. The output of the op-amp 3 is coupled with a gate terminal 44 of a MOSFET 22 (described later) of the current controller 4.

Figure 2:
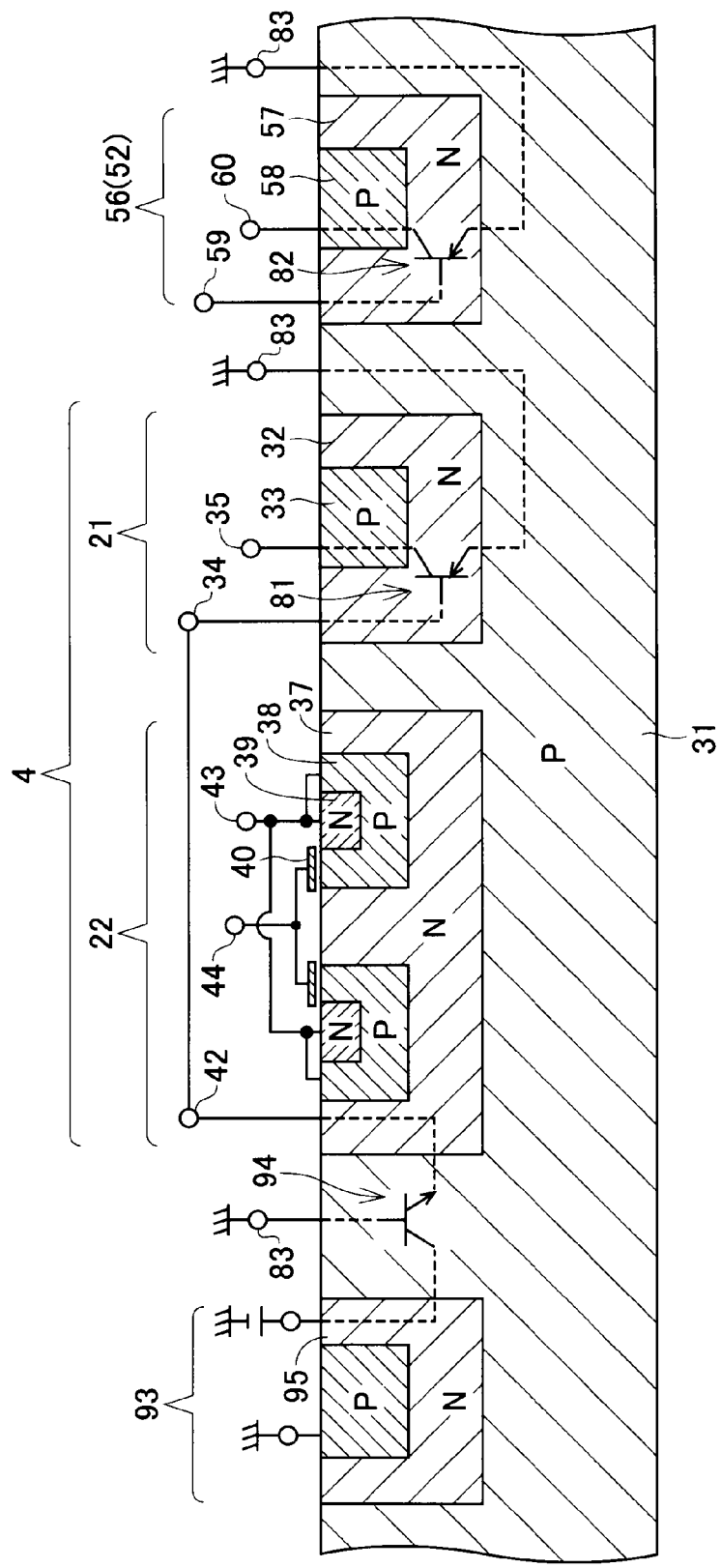
FIG. 2 shows a cross section of a substrate of a semiconductor in which the current detector is formed.

The current controller 4 is comprised of the MOSFET 22 and a diode 21 coupled to the MOSFET 22 in series. Referring to FIG. 2 as well as FIG. 1, the MOSFET 22 is preferably of a double-diffused NPN type. Moreover, the diode 21 is preferably of a PN junction type, in which an anode terminal 35 is coupled with the detection node 16 and a cathode terminal 34 is coupled with a drain terminal 42 of the MOSFET 22. Thus the diode 21 prevents impression of negative voltage on the drain of the MOSFET 22.

The op-amp 3 produces an output voltage corresponding to voltage difference between the nodes 15 and 16, and then applies the output voltage to the gate of the MOSFET 22. In response, the MOSFET 22 controls the current Idet2 from the drain to the source in accordance with the applied voltage. Until the voltage difference is gone, the current controller 4 with the op-amp 3 changes the current Idet2. Thus the current controller 4 with the op-amp 3 controls the current Idet2 so as to equalize voltages at the detection node 16 and the output node 15. Here, the current Idet1 should be identical to the current Idet2 if current leak does not occur.

Referring mainly to FIG. 2, the diode 21 is formed in a P-type silicon substrate 31 and comprised of an N-region 32 as the cathode formed in the substrate 31 and a P-region 33 as the anode formed in the N-region 32. The N-region 32 is coupled with the cathode terminal 34 and the P-region 33 is coupled with the anode terminal 35. In the meantime, the P-type silicon substrate 31 grounded via an ISO terminal 83, in combination with the N-region 32 and the P-region 33, may form a parasitic transistor 81 of a PNP-type.

The MOSFET 22 is, as being monolithic with the diode 21, formed within the P-type silicon substrate 31. The MOSFET 22 is comprised of a first N-region 37 formed in the P-type substrate 31, one or more P-regions 38 formed in the N-region 37, and one or more second N-regions 39 respectively formed in the P-regions 38. Gate electrodes with intervening dielectric layers of silicon dioxide are respectively formed on these NPN junctions so that each electrode 40 ranges from one of the second N-region 39 through the corresponding P-region 38 to the first N-region 37. The gate electrodes 40 are coupled with the gate terminal 44.

The N-regions 32, 37, 39 are respectively formed by doping limited regions of the P-type substrate 31 and the P-region 38 with donor impurities. The P-regions 33, 38 are respectively formed by doping limited regions of the N-regions 32, 37 with acceptor impurities.

In the common substrate, another diode 93 or any element for another adjacent circuitry is formed in relatively close relation to the MOSFET 22. Thus a combination of the N-region 37 of the MOSFET 22, the P-type silicon substrate 31 grounded via the ISO terminal 83, and an N-region 95 of the diode 93, may form a parasitic transistor 94.

Referring again to FIG. 1, the monitor current output portion 5 has a monitor node 72 and is coupled with the current controller 4. The monitor current output portion 5 is comprised of a current mirror portion 51 formed of paired transistors 53, 54 of an NPN bipolar type mutually connected in a so-called current mirror configuration. The monitor current output portion 5 is further comprised of a current compensator 52 interposed between the current mirror portion 51 and the monitor node 72.

The collector of the transistor 53 is coupled with the source of the MOSFET 22 of the current controller 4, thereby receiving the detection current Idet2, and the collector of the transistor 54 is coupled with the current compensator 52 connected in series. Thus the monitor current output portion 5 mirrors the detection current Idet2 in the current controller 4 to the current compensator 52, thereby shifting a monitor current Imon1 through the current compensator 52.

Referring again to FIG. 2 as well as FIG. 1, the current compensator 52 is comprised of a compensation diode 56, in which an anode terminal 60 is coupled with the monitor node 72 and a cathode terminal 59 is coupled with the collector of the transistor 54.

The compensation diode 56 is, as shown in FIG. 2, also formed within the P-type silicon substrate 31 to have an N-region 57 as the anode and a P-region 58 as the cathode formed in the N-region 57, thereby having a common structure with the diode 21 of the current controller 4. As having the common structure, electric properties of the compensation diode 56 are the same as those of the diode 21.

Moreover, a combination of the P-type silicon substrate 31, the N-region 57 and the P-region 58 may form a parasitic transistor 82, as with the case of the diode 21. Thus, when the parasitic transistor 81 shifts a leak current Ileak1, the parasitic transistor 82 also shifts a leak current Ileak2 equivalent to the current Ileak1 under the same condition.

As being compensated by the current compensator 52, the monitor current output portion 5 mirrors the detection current Idet1 to the monitor node 72, as a monitor current Imon2. To the monitor node 72, an external monitor device may be coupled for the purpose of monitoring the monitor current Imon2.

The current detector 1 as structured as above functions in a way as described hereinafter.

When the driver circuitry 13 applies a required voltage to the gates of the MOSFETs 11, 12, the switch portion 2 is switched ON. Then the MOSFET 11 made active shifts a power current Iout from the input node 71 through the output node 15 to the load 90, thereby powering the load 90. Simultaneously, the MOSFET 12 made active shifts a detection current Idet1 through the detection node 16 to the current controller 4.

As the output node 15 is further coupled to the non-inverting input of the op-amp 3 and the detection node 16 is coupled to the inverting input of the op-amp 3, the op-amp 3 produces an output voltage in accordance with voltage difference between the nodes 15 and 16. Thus the MOSFET 22 receiving the output voltage changes the detection current Idet2 so as to reduce the voltage difference. As a result, voltages at the nodes 15 and 16 are retained equal by the op-amp 3.

Flow of the current through the diode 21 produces a potential difference Vf between the anode and the cathode thereof. This potential difference Vf is also applied to the parasitic transistor 81 as these are mutually coupled in parallel, thereby generating a leak current Ileak1 through the parasitic transistor 81. The detection current Idet2 to the monitor current output portion 5 is the remainder of the detection current Idet1 from which the leak current Ileak1 is subtracted, as represented by the following equation.

$$Idet2 = Idet1 - Ileak1 \qquad (1)$$

Next, the detection current Idet2 in the transistor 53 is mirrored to a current Imon1 through the transistor 54.

The current Imon1 flowing through the compensation diode 56 produces a potential difference Vf as being equivalent to the potential difference Vf at the diode 21. This potential difference Vf is also applied to the parasitic transistor 82, thereby generating a leak current Ileak2. The monitor current Imon2 through the monitor node is the sum of the current Imon1 and the Ileak2, as represented by the following equation.

$$Imon2 = Imon1 + Ileak2 \qquad (2)$$

As the diode 21 and the compensation diode 56 have a common structure, these leak currents Ileak1 and Ileak2 are inherently equivalent. Considering this fact and the aforementioned equation (1) in combination, the following equation is given.

$$\begin{aligned} Imon2 &= Idet2 + Ileak2 \\ &= Idet1 - Ileak1 + Ileak2 \\ &= Idet1 \end{aligned}$$

Thus it is assured that the monitor current Imon2 at the monitor node 72 is equivalent to the detection current Idet1, regardless of parasitic elements generated in the current detector 1. If a monitor device is connected with the monitor node 72 to monitor the monitor current Imon2, the detection current Idet1 can be indirectly monitored without influence on the switch portion 2 and the current controller 4.

Next, when the driver circuitry 13 stops applying the required voltage to the gates of the MOSFETs 11, 12, the switch portion 2 is switched OFF, thereby stopping the power to the load 90. Inductance of the load 90 may generate an induced electromotive force.

As already explained with reference to FIG. 2, the parasitic transistor 94 may be formed of the N-region 37 of the MOSFET 22, the P-type silicon substrate 31 grounded via the ISO terminal 83, and an N-region 95 of the diode 93. Without the diode 21, the induced electromotive force would produce negative potential at the drain terminal 42 of the MOSFET 22 as the load 90 is coupled with the node 16 via the switch portion 2. This negative potential would produce a current flowing in the parasitic transistor 94 from the N-region 95 of the diode 93 impressed a positive potential to the N-region 37 of the MOSFET 22. Then the adjacent circuitry related to the diode 93 would malfunction.

However, because the current detector 1 is comprised of the diode 21, impression of negative potential on the drain terminal 42 of the MOSFET 22 is prevented. As a result, a leak current through the parasitic transistor 94 is reduced. Thus the adjacent circuitry related to the diode 93 is prevented from malfunctioning.

Further, as the compensation diode 56 having the common structure with the diode 21 is provided, a leak current Ileak2 generated by the accompanying parasitic transistor 82 would compensate a leak current Ileak1 even if the parasitic transistor 81 accompanying the diode 21 would generate it. Thus equivalence between the Imon2 through the monitor device and the detection current Idet1 through the detection node 16 is assured. Consequently the current detector 1 contributes to accurate current monitoring.

The first embodiment will be modified in various ways including the following second and third embodiments.

Figure 3:
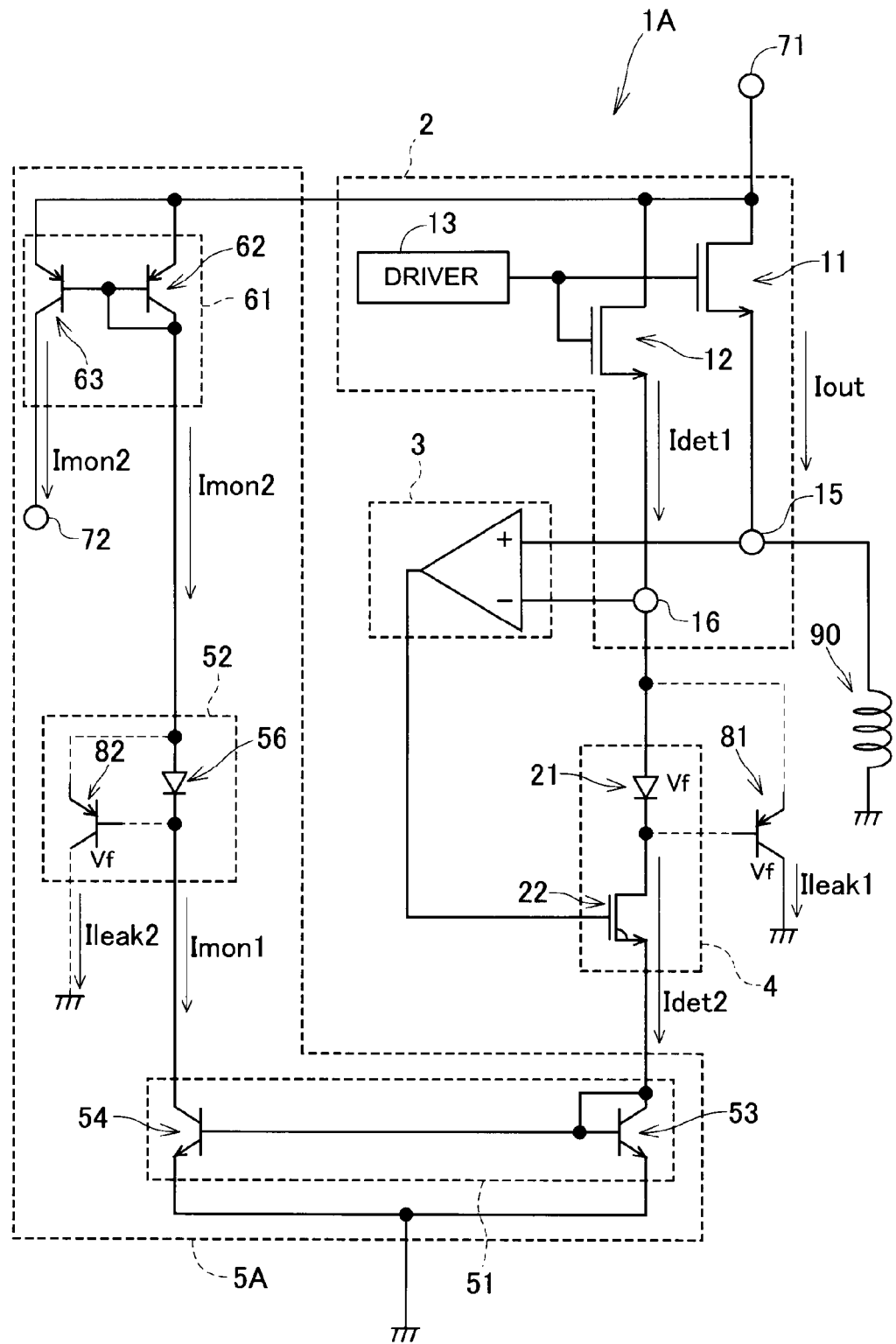
FIG. 3 is a circuit diagram of a current detector in accordance with a second embodiment.

With reference to FIG. 3, the second embodiment will be described hereinafter.

A current detector 1A according to the second embodiment is comprised of a modified monitor current output portion 5, in which a second current mirror portion 61 is further provided in addition to a first current mirror portion 51 substantially identical to the current mirror portion 51 of the first embodiment.

The second current mirror portion 61 is to mirror the monitor current Imon2 in the current compensator 52 to a monitor node 72. Paired transistors 62, 63 of the second current mirror portion 61 are both of a PNP type. The collector of the transistor 62 is coupled with the anode terminal 60 of the compensation diode 56 of the current compensator 52. The collector of another transistor 63 is coupled with the monitor node 72, to which an external monitor device may be coupled for the purpose of monitoring the mirrored current Imon2.

The emitters of the transistors 62, 63 are commonly coupled with the input node 71. Thus these emitters of the second current mirror portion 61 and the input of the switch portion 2 are assured to be a common potential. This causes that the anode of the diode 56 is also substantially at the same potential, thereby reducing difference between the detection current Idet1 through the detection node 16 and the monitor current Imon2 through the monitor node 72. Consequently, the current detector 1A provides current monitoring with further accuracy as well as effects identical or similar to those of the first embodiment.

Figure 4:
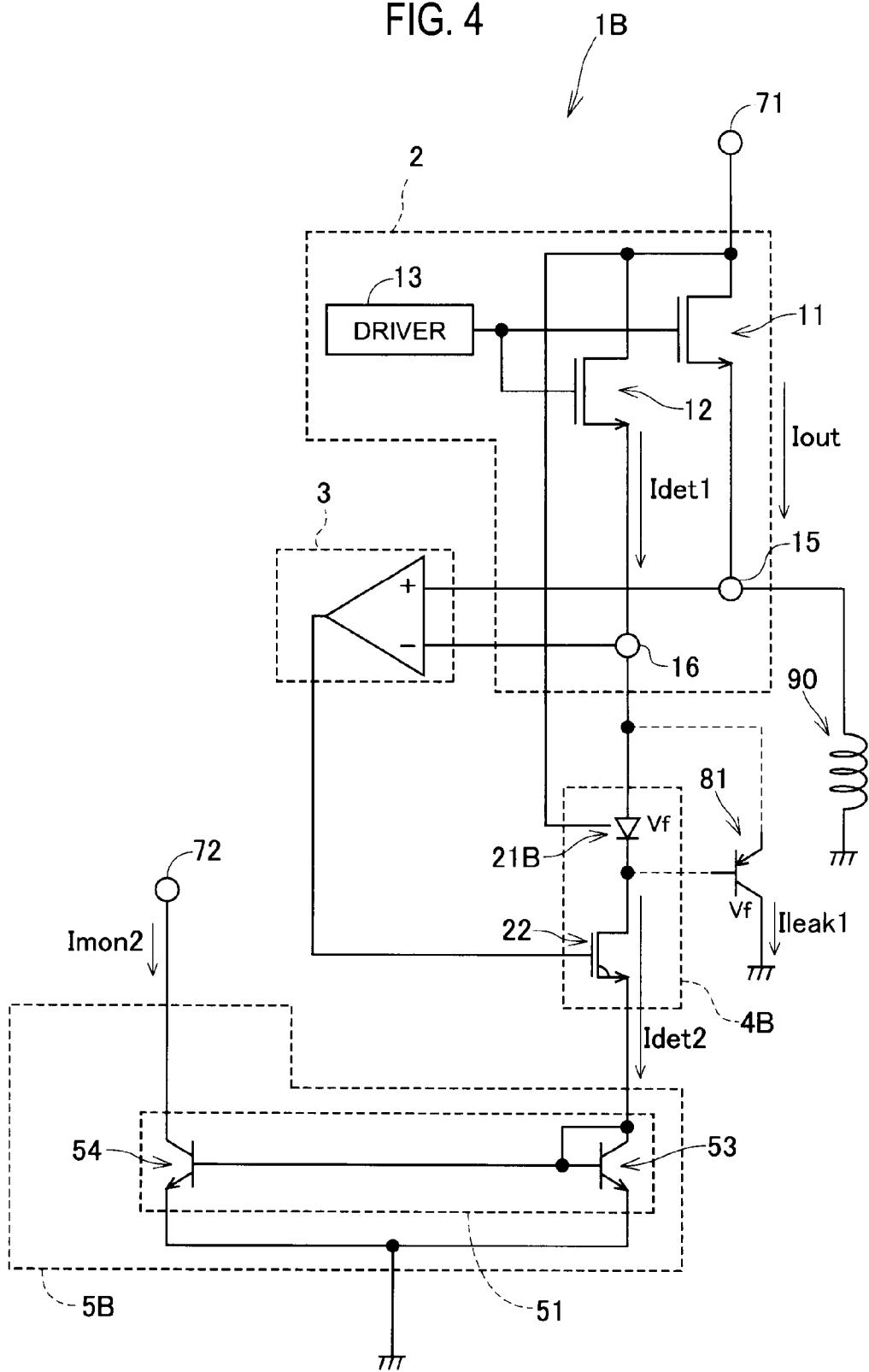
FIG. 4 is a circuit diagram of a current detector in accordance with a third embodiment.
Figure 5:
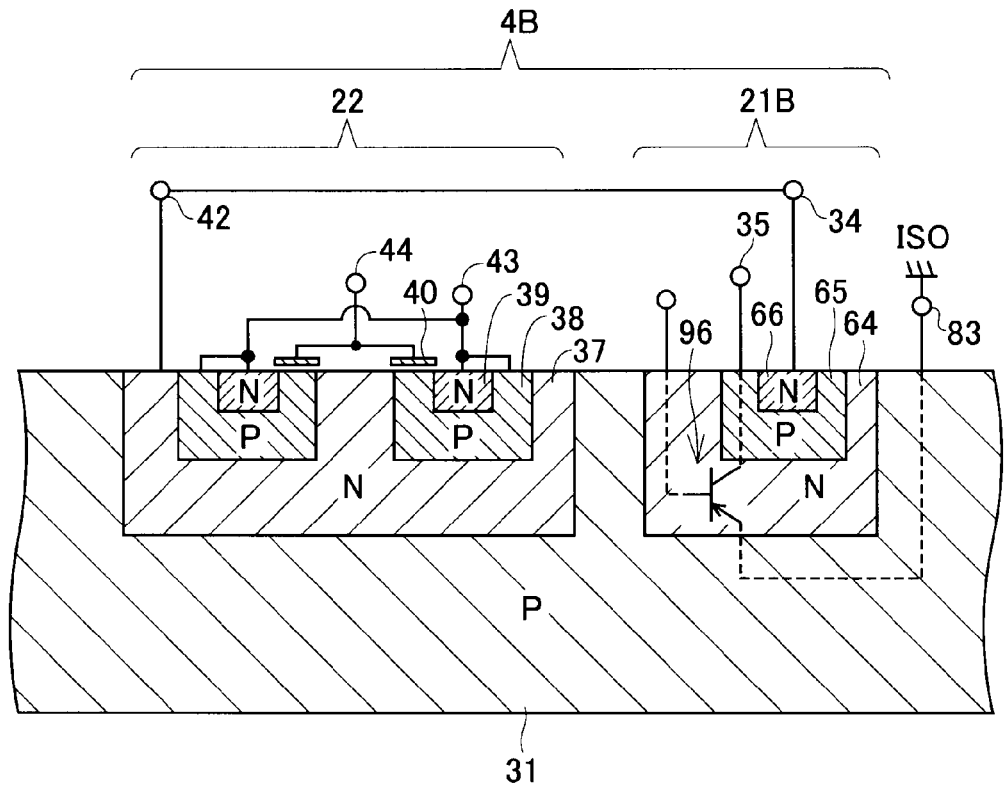
FIG. 5 shows a partial cross section of a substrate of a semiconductor in which the current detector is formed.
Figure 6:
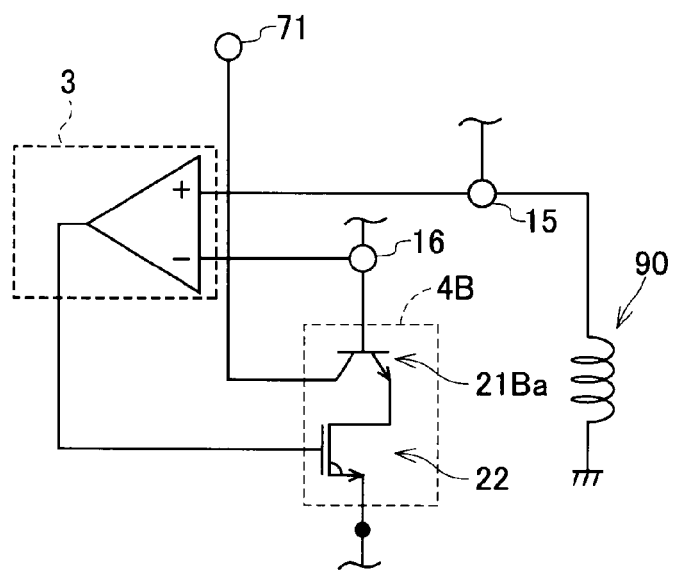
FIG. 6 is an equivalent circuit diagram of a current controller included in any of the current detectors.

With reference to FIGS. 4 through 6, the third embodiment will be described hereinafter.

A current detector 1B according to the third embodiment is comprised of a modified current controller 4B having a diode 21B monolithically formed with the MOSFET 22 within a common P-type silicon substrate 31.

The diode 21B is comprised of an N-region 64 as a tub region formed in the substrate 31, a P-region 65 formed in the N-region 64, and a N-region 66 further formed in the P-region 65. The anode terminal 34 is, unlike the first embodiment, coupled with the N-region 66 as an anode. The P-region as a cathode is coupled with the cathode terminal 35 as with the first embodiment.

While a combination of the P-region 65, the N-region and the P-type substrate 31 might be considered as a parasitic transistor 96 as shown in FIG. 5, this parasitic transistor 96 would be electrically isolated from its peripheries because the N-region 64 as a tub region is kept to be a highest potential. Instead, a parasitic transistor 21Ba of a NPN type may be constituted of the N-region 64, the P-region 65 and the N-region 66, where the N-region 64 as a collector, the P-region 65 as a base and the N-region 66 as an emitter. Thus the current controller 4B and its peripheries can be represented by an equivalent circuit diagram shown in FIG. 6. This transistor 21Ba in return for the diode 21B prevents impression of negative potential on the drain terminal 42 of the MOSFET 22. The present embodiment provides effects identical or similar to those of the first embodiment.

Although the invention has been described above by reference to certain embodiments of the invention, the invention is not limited to the embodiments described above. Modifications and variations of the embodiments described above will occur to those skilled in the art, in light of the above teachings.

What is claimed is:

1. A current detector comprising:
   a switch portion having an input node, an output node and a detection node, the switch portion being configured to divide an input current supplied to the input node into a power current between the input node and the output node and a detection current between the input node and the detection node;
   a current controller configured to control the detection current so as to equalize voltages at the detection node and the output node, the current controller being coupled with the detection node and the output node and including a transistor and a diode coupled to the transistor in series so as to prevent impression of negative voltage on the transistor, the transistor and the diode being formed within a single monolithic substrate; and
   a monitor current output portion having a monitor node and being coupled with the current controller, the monitor current output portion being configured to mirror the detection current in the current controller to the monitor node,
   wherein the monitor current output portion comprises;
   a first current mirror portion including an input transistor coupled with the current controller and an output transistor so linked with the input transistor and the monitor node as to mirror the detection current in the input transistor to the monitor node; and
   a current compensator including a compensation diode having a common structure with the diode of the current controller, the compensation diode being coupled with the output transistor in series.

2. The current detector of claim 1, further comprising:
   a second current mirror portion coupled with the input node and including a first transistor and a second transistor, an output terminal of the first transistor being coupled with the compensation diode in series, the second transistor being configured to shift a monitor current mirrored from the detection current to the monitor node.

3. The current detector of claim 1, wherein the substrate is P-doped, the transistor of the current controller is a NPN-type, the diode of the current controller comprises an N-type tub region formed within the P-type substrate, an anode of a P-type region formed within the N-type tub region, and a cathode of an N-type region, and the N-type tub region is coupled with the input node.

* * * * *